(12) United States Patent
Kondo

(10) Patent No.: US 11,448,709 B1
(45) Date of Patent: Sep. 20, 2022

(54) BATTERY SYSTEM FOR BATTERY DEGRADATION ESTIMATION

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 22 days.

(21) Appl. No.: 17/190,923

(22) Filed: Mar. 3, 2021

(51) Int. Cl.
*G01R 31/392* (2019.01)
*H02J 7/00* (2006.01)
*G01R 31/388* (2019.01)
*G01R 31/389* (2019.01)

(52) U.S. Cl.
CPC ......... *G01R 31/392* (2019.01); *G01R 31/388* (2019.01); *G01R 31/389* (2019.01); *H02J 7/005* (2020.01); *H02J 7/0048* (2020.01)

(58) Field of Classification Search
None
See application file for complete search history.

(56) References Cited

U.S. PATENT DOCUMENTS

| | | |
|---|---|---|
| 2011/0316548 A1 | 12/2011 | Ghantous et al. |
| 2012/0032648 A1 | 2/2012 | Ghantous et al. |
| 2012/0200266 A1 | 8/2012 | Berkowitz et al. |
| 2012/0203483 A1 | 8/2012 | Ghantous et al. |
| 2013/0154548 A1 | 6/2013 | Berkowitz et al. |
| 2013/0311115 A1 | 11/2013 | Chaturvedi et al. |
| 2013/0311116 A1 | 11/2013 | Chaturvedi et al. |
| 2013/0311117 A1 | 11/2013 | Chaturvedi et al. |
| 2014/0021959 A1 | 1/2014 | Maluf et al. |
| 2014/0312912 A1 | 10/2014 | Berkowitz et al. |
| 2015/0025825 A1* | 1/2015 | Yoshida .............. H01M 10/486 702/63 |
| 2015/0153417 A1 | 6/2015 | Maluf et al. |
| 2015/0219722 A1 | 8/2015 | Maluf et al. |
| 2015/0377976 A1 | 12/2015 | Maluf et al. |
| 2017/0146608 A1 | 5/2017 | Lee et al. |
| 2017/0153292 A1 | 6/2017 | Steiber et al. |
| 2017/0219660 A1 | 8/2017 | Christensen et al. |
| 2017/0225584 A1 | 8/2017 | Jin et al. |
| 2017/0229891 A1 | 8/2017 | Lee et al. |
| 2017/0242077 A1 | 8/2017 | Guo et al. |
| 2017/0242078 A1 | 8/2017 | Kuper et al. |
| 2017/0244137 A1 | 8/2017 | Guo et al. |
| 2018/0090941 A1 | 3/2018 | Ramachandran et al. |

(Continued)

*Primary Examiner* — Jas A Sanghera
(74) *Attorney, Agent, or Firm* — Brake Hughes Bellermann LLP

(57) ABSTRACT

According to an aspect, a battery system includes a current sensor configured to measure a current that charges or discharges a battery, a voltage monitor configured to measure a cell voltage of the battery, a state-of-charge (SoC) calculation engine configured to calculate an SoC value, and an energy calculation engine configured to compute charge energy loss of the battery for a sampling period based on the current, cell voltage, and the SoC value and compute a capacity degradation metric based on the charge energy loss and reference charge loss of a reference battery. The energy calculation engine is configured to transmit, via an interface, the capacity degradation metric to a battery manager of a device.

20 Claims, 8 Drawing Sheets

(56) References Cited

U.S. PATENT DOCUMENTS

| | | |
|---|---|---|
| 2018/0278053 A1 | 9/2018 | Uan-Zo-li et al. |
| 2018/0321323 A1 | 11/2018 | Dubarry et al. |
| 2019/0305568 A1 | 10/2019 | Hand et al. |
| 2019/0346510 A1 | 11/2019 | Kondo |
| 2020/0164763 A1 | 5/2020 | Holme |
| 2020/0182937 A1 | 6/2020 | Wampler, II |
| 2020/0185792 A1 | 6/2020 | Wampler, II et al. |

* cited by examiner

BATTERY SYSTEM FOR BATTERY DEGRADATION ESTIMATION

TECHNICAL FIELD

This description relates to a battery system for battery degradation estimation.

BACKGROUND

A battery (e.g., a Lithium-Ion battery) is prone to aging, which can cause battery capacity degradation or capacity fade, leading to a decrease in battery performance. The battery's capacity may be used as a criterion to evaluate the state of the battery. Usable capacity may refer to the maximum capacity in theory that a fully charged battery can release. In some examples, usable capacity may be used as an indicator of state of health (SoH), which is used to describe battery aging status. In order to measure the SoH level, in some examples, the battery is removed from the device, and the battery is tested to measure capacity and/or the battery's internal resistance is measured using a special instrument.

SUMMARY

According to an aspect, a battery system includes a current sensor configured to measure a current that charges or discharges a battery, a voltage monitor configured to measure a cell voltage of the battery, a state-of-charge (SoC) calculation engine configured to calculate an SoC value, and an energy calculation engine configured to compute charge energy loss of the battery for a sampling period based on the current, cell voltage, and the SoC value and compute a capacity degradation metric based on the charge energy loss and reference charge loss of a reference battery. The energy calculation engine is configured to transmit, via an interface, the capacity degradation metric to a battery manager of a device.

According to some aspects, the battery system may include one or more of the following aspects. The energy calculation engine is configured to derive an open-cell voltage from the SoC value and/or compute the charge energy loss based on the current and a difference between the cell voltage and the open-cell voltage. The energy calculation engine is configured to derive an open-cell voltage from the SoC value, compute actual charge energy of the battery based on the open-cell voltage and the current, compute total charge energy of the battery based on the cell voltage and the current, and/or compute the charge energy loss based on the actual charge energy and the total charge energy. The energy calculation engine is configured to determine an internal resistance of the reference battery from battery characteristic data using at least one of temperature or the SoC value and/or compute the reference charge loss of the reference battery based on the internal resistance of the reference battery and the current. The energy calculation engine is configured to compute the capacity degradation metric based on a ratio of the reference charge loss and the charge energy loss. The battery system may include a charge detector configured to determine whether the battery is in a charge mode or a discharge mode. The energy calculation engine is configured to be activated during the charge mode to compute the capacity degradation metric. The energy calculation engine is configured to be activated during the discharge mode to compute the capacity degradation metric.

According to an aspect, a device includes a battery, a current sensor configured to measure a current that charges or discharges the battery, a voltage monitor configured to measure a cell voltage of the battery, a state-of-charge (SoC) calculation engine configured to obtain SoC value, and an energy calculation engine configured to compute charge energy loss of the battery for a sampling period based on the current, the cell voltage, and the SoC value, and compute a capacity degradation metric based on the charge energy loss and reference charge loss of a reference battery, and a battery manager configured to receive, via an interface, the capacity degradation metric from the energy calculation engine.

According to some aspects, the device may include one or more of the following features. The energy calculation engine is configured to derive an open-cell voltage from the SoC value and compute the charge energy loss based on the current and a difference between the cell voltage and the open-cell voltage. The energy calculation engine is configured to derive an open-cell voltage from the SoC value, compute actual charge energy of the battery based on the open-cell voltage and the current, compute total charge energy of the battery based on the cell voltage and the current, and/or compute the charge energy loss based on the actual charge energy and the total charge energy. The energy calculation engine is configured to determine an internal resistance of the reference battery from battery characteristic data using at least one of temperature or the SoC value and/or compute the reference charge loss of the reference battery based on the internal resistance of the reference battery and the current. The capacity degradation metric includes a state of health metric. The device may include a charge detector configured to determine whether the battery is in a charge mode or a discharge mode. The energy calculation engine is configured to be activated during the charge mode to compute the capacity degradation metric. The energy calculation engine is configured to be activated during the discharge mode to compute the capacity degradation metric. The battery manager includes a battery life estimator configured to adjust a battery life estimate based on the capacity degradation metric. The battery manager includes an alert generator configured to generate an alert in response to the capacity degradation metric achieving a threshold level.

According to an aspect, a method includes measuring a current that charges or discharges a battery, measuring a cell voltage of the battery, calculating a state-of-charge (SoC) value, computing charge energy loss of the battery for a sampling period based on the current, the cell voltage, and the SoC value, computing a capacity degradation metric based on the charge energy loss and reference charge loss of a reference battery, and transmitting, via an interface, the capacity degradation metric to a battery manager of a device. In some examples, the computing the charge energy loss energy includes deriving an open-cell voltage from the SoC value and computing the charge energy loss based on the current and a difference between the cell voltage and the open-cell voltage. In some examples, the computing the charge energy loss energy includes deriving an open-cell voltage from the SoC value, computing actual charge energy of the battery based on the open-cell voltage and the current, computing total charge energy of the battery based on the cell voltage and the current, and/or computing the charge energy loss based on the actual charge energy and the total charge energy. In some examples, the method includes determining an internal resistance of the reference battery from battery characteristic data using at least one of temperature or the SoC value, computing the reference charge loss of the reference battery based on the internal resistance of the reference battery and the current, and/or computing the capacity degradation metric based on a ratio of the reference charge loss and the charge energy loss.

The details of one or more implementations are set forth in the accompanying drawings and the description below. Other features will be apparent from the description and drawings, and from the claims.

DETAILED DESCRIPTION

Figure 1A:
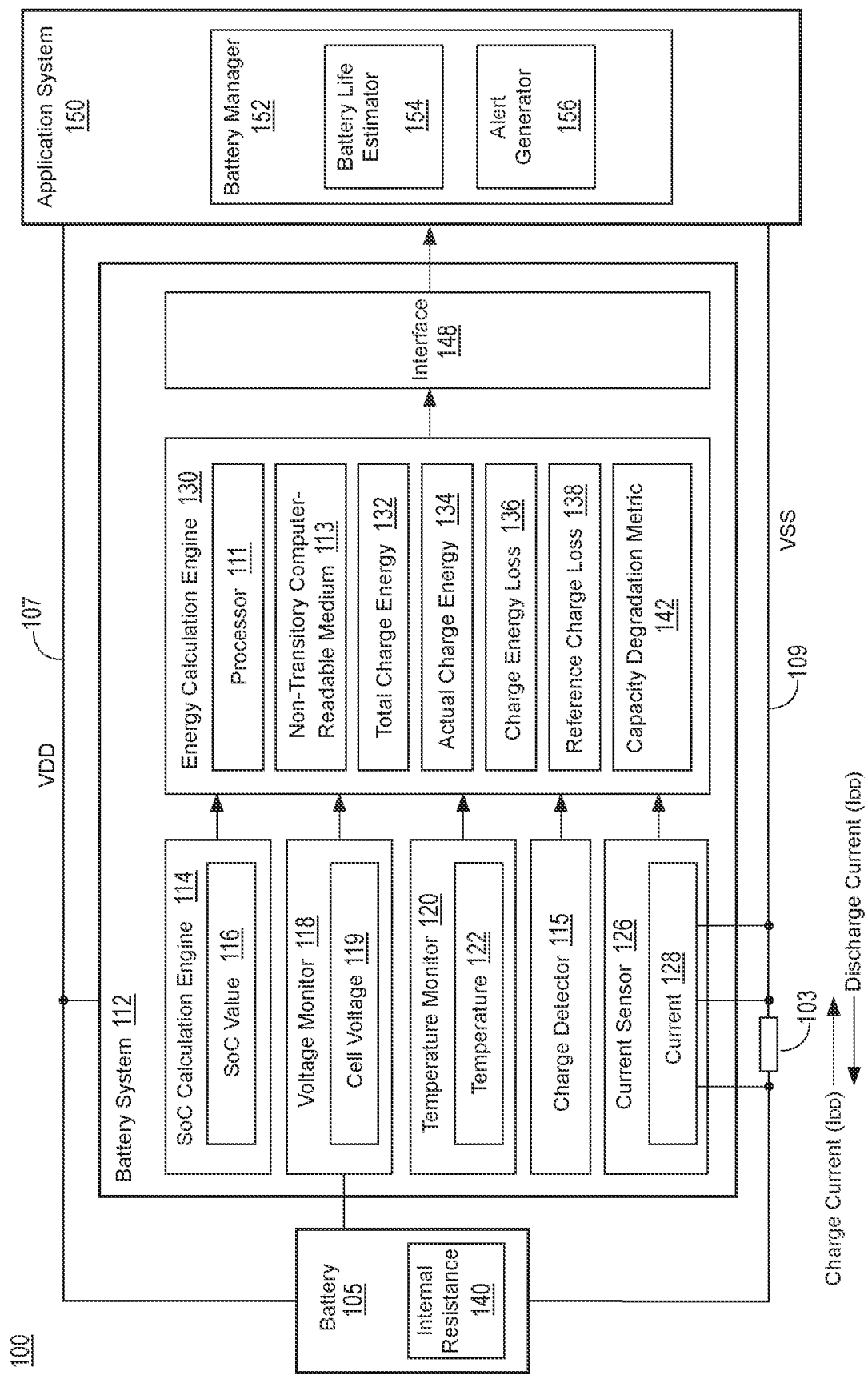
FIG. 1A illustrates a device having a battery system for computing a capacity degradation metric according to an aspect.

The present disclosure relates to a battery system (e.g., a battery fuel gauge) configured to compute a capacity degradation metric in a manner that does not require the battery to be removed from the device. The capacity degradation metric may be computed during the charging and/or discharging of the battery (e.g., while the device is in use). The capacity degradation metric may include a state of health (SoH) metric. The SoH metric may be a figure of merit of the condition of a battery as compared to a reference (e.g., new) battery (or to its ideal conditions). In some examples, the capacity degradation metric is a battery aging status, e.g., providing a level of battery aging. In some examples, the capacity degradation metric is a battery capacity fading metric. In some examples, the battery system is configured to measure the battery's internal resistance within the general gauging process in a manner that does not require the removal of the battery from the device, and the capacity degradation metric may be extracted from the battery's internal resistance.

In some examples, using measured values by the battery system (e.g., cell voltage, charging/discharging current, state-of-charge (SoC) value, temperature, etc.), the battery system is configured to compute charge energy loss (e.g., actual charge energy loss) caused by the internal resistance of the battery. For instance, the charge energy loss computed by the battery system may be the actual energy loss caused by the battery's internal resistance in a charge operation (or a discharge operation). Over time, the internal resistance of the battery may increase, thereby causing an increase in charge energy loss.

In some examples, the battery system is configured to compute actual charge energy of the battery and total charge energy of the battery during a sampling period, where a difference between the actual charge energy and the total charge energy may represent the charge energy loss caused by the internal resistance of the battery. In some examples, the total charge energy may be computed based on cell voltage×$I_{DD}$×time, where the cell voltage is monitored by a voltage monitor, the current ($I_{DD}$) is monitored by a current sensor, and the time is the sampling period indicated by a timer. In some examples, the actual charge energy of the battery may be computed based on open-cell voltage (OCV)×$I_{DD}$×time, where the OCV value is derived from the computed SoC value using a look-up table, the current ($I_{DD}$) is monitored by the current sensor, and the time is the sampling period. In some examples, the battery system may compute a difference between the total charge energy and the actual charge energy to determine the charge energy loss (e.g., the actual charge energy loss).

In some examples, the battery system is configured to compute charge energy loss (e.g., actual charge energy loss) caused by the internal resistance of the battery based on a voltage difference ($\Delta V$)×$I_{DD}$×time, where $\Delta V$ is the difference between OCV value and the cell voltage, the current ($I_{DD}$) is the current measured by the current sensor, and the time is the sampling period. If the charge mode is detected, $\Delta V$ is the cell voltage−OCV value. If the discharge mode is detected, $\Delta V$ is the OCV value−cell voltage. In some examples, $\Delta V$ is also equal to the internal resistance (aged R(in))×the current ($I_{DD}$), where the charge energy loss is equal to aged R(in)×$I_{DD}$×$I_{DD}$×time.

The battery system may also compute a reference charge loss associated with a reference battery (e.g., a new battery) during the sampling period. For example, using battery characteristic data, the battery system may obtain an internal resistance of the reference battery. In some examples, the battery characteristic data may identify values of the internal resistance for the reference battery as a function of temperature and/or SoC. For example, the internal resistance may change based on the temperature and/or SoC. For relatively low temperatures, the internal resistance may be higher. Also, in some examples, the internal resistance may have different values depending on the SoC level. In some examples, the battery characteristic data includes a look-up table that provides the reference battery's internal resistance for different values of temperature and/or SoC. The battery system may receive the measured temperature and SoC value corresponding to the battery included in the device and use the temperature and the SoC value to obtain the reference battery's internal resistance from the battery characteristic data.

Then, the battery system computes the reference charge loss based on the internal resistance and the current measured by the battery system during the sampling period. In some examples, the battery system computes the reference charge loss based on new R(in)×$I_{DD}$×$I_{DD}$×time, where new R(in) is the reference battery's internal resistance obtained from the look-up table using the SoC value and/or the measured temperature, the current ($I_{DD}$) is obtained from the current sensor, and the time is the sampling period.

The battery system compares the reference charge loss with the charge energy loss to compute the capacity degradation metric. In some examples, the battery system computes a ratio of the reference charge loss with the charge energy loss to derive the capacity degradation metric. In some examples, the ratio (charge energy loss/reference charge loss) is equal to the ratio (aged R(in)/new R(in)), and the battery system may extract the battery's internal resistance (aged R(in)) using the charge energy loss, the reference charge loss, and the new R(in) based on the equation [(charge energy loss/reference charge loss)=(aged (Rin)/(new R(in)]. In some examples, the battery system may compute the capacity degradation metric based on the battery's internal resistance (aged R(in)) and the reference battery's internal resistance (new R(in)) (e.g., SoH is new R(in)/aged R(in)×100). In some examples, the battery system includes capacity loss data that provides capacity loss values for different values of internal resistance. In some examples, the battery system may compute the capacity degradation metric based on the capacity loss value obtained from the capacity loss data using the battery's internal resistance (aged R(in)).

FIGS. 1A through 1G illustrate a device 100 having a battery system 112 configured to compute a capacity degradation metric 142 of a battery 105 while the battery 105 is in a charge mode and/or a discharge mode. For example, the battery system 112 is configured to compute the capacity degradation metric 142 in a manner that does not require the battery 105 to be removed from the device 100.

The capacity degradation metric 142 may be a state of health (SoH) metric of the battery 105. The SoH metric may be considered a figure of merit of the condition of the battery 105 as compared to its ideal conditions (or a new battery). In some examples, the SoH metric is expressed as a percentage point (e.g., 100% SoH is when the battery's conditions match the battery's specification). Typically, a battery's SoH will be 100% at the time of manufacture and will decrease over time and use. However, a battery's performance at the time of manufacture may not meet its specifications, in which case its initial SoH will be less than 100%. In some examples, the capacity degradation metric 142 may indicate a level of capacity loss due to aging or other factors. In some examples, the capacity degradation metric 142 is a battery aging status, e.g., providing a level of battery aging. In some examples, the capacity degradation metric 142 is a battery capacity fading metric. In some examples, the battery system 112 is configured to measure an internal resistance 140 of the battery 105 within the general gauging process in a manner that does not require the removal of the battery 105 from the device 100, and the capacity degradation metric 142 may be extracted from the battery's internal resistance 140.

As shown in FIG. 1A, the device 100 includes a battery 105, a battery system 112 coupled to the battery 105, and an application system 150 that receives information (e.g., the capacity degradation metric 142) from the battery system 112 via an interface 148. In some examples, the battery system 112 is a battery fuel gauge. The device 100 may be any type of device having a battery 105 (e.g., a rechargeable battery) such as a laptop, tablet, smartphone, smartwatch, headset, electric tool, battery-powered vehicle, smart power bank, etc.

The battery 105 may include any type of rechargeable battery containing one or more battery cells. In some examples, the battery 105 may be a lithium ion (Li-ion) battery containing one or more Li-ion cells. In some examples, the battery 105 may be a nickel-based battery such as a nickel-cadmium (NiCd) battery or a nickel-metal hydride (NiMH) battery.

The battery 105 defines an internal resistance 140. In some examples, the internal resistance 140 may be referred to as aged R(in). The internal resistance 140 may be defined as the opposition to the flow of current 128 within the battery 105. The internal resistance 140 may cause energy loss when charge energy is transferred from a charger 104 to the battery 105 during the charge mode or when charge energy is transferred from the battery 105 to the application system 150 during the discharge mode. The value for the internal resistance 140 may be correlated with the aging of the battery 105. For instance, if the battery 105 is relatively new, the internal resistance 140 may be low, thereby causing low charge losses when the battery 105 is charged or discharged. However, if the battery 105 is relatively old, the internal resistance 140 may be high, thereby causing higher charge losses when the battery 105 is charged or discharged and the relationship between battery capacity and internal resistance is inversely proportional. However, as indicated above, it may be relatively difficult to measure the value of the internal resistance 140 without removing the battery 105 from the device 100.

The battery 105 is coupled to the application system 150 via a power source line 107 (e.g., VDD) and a power source line 109 (e.g., VSS). The battery system 112 is coupled to the battery 105. The battery system 112 is coupled to the power source line 107 and the power source line 109. The battery system 112 includes an interface 148 configured to permit the battery system 112, the application system 150, and the charger 104 to communicate with each other. In the charge-mode, the battery 105 is charged by the charger 104 (as shown in FIG. 1C) (e.g., charge energy is transferred from the charger 104 to the battery 105). In the discharge-mode, charge energy is transferred from the battery 105 to the application system 150 for powering one or more components of application system 150 (as shown in FIG. 1D).

Based on information measured by the battery system 112 during the charge mode and/or the discharge-mode (e.g., current 128, temperature 122, cell voltage 119, SoC value 116, etc.), the battery system 112 computes a capacity degradation metric 142, and may transmit the capacity degradation metric 142 to the application system 150 via the interface 148. In some examples, the battery system 112 computes the capacity degradation metric 142 during the charge mode. In some examples, the battery system 112 computes the capacity degradation metric 142 during the discharge mode. In some examples, the battery system 112 periodically computes the capacity degradation metric 142. In some examples, the battery system 112 computes the capacity degradation metric 142 in response to the expiration of a period of time, e.g., once a day, week, year, etc. In some examples, the battery system 112 computes the capacity degradation metric 142 after a certain number of recharge events or discharge events. The application system 150 may use the capacity degradation metric 142 to provide information about the battery 105 and/or control one or more functions of the device 100.

The battery manager 152 may include a battery life estimator 154 configured to estimate a battery life of the battery 105. For example, the battery life estimator 154 may estimate a period of time that the device 100 can be operated based on the current level of the battery 105 (e.g., five hours of battery based on current usage). In some examples, depending on the application of the device 100, the battery life estimator 154 may characterize the type of activity that can be done based on the current level of the battery 105. For example, in terms of a battery-powered vehicle, the battery life estimator 154 may determine the distance that the vehicle can be driven based on the current level of the battery 105. The battery life estimator 154 may receive the capacity degradation metric 142 and adjust the battery life estimation based on the capacity degradation metric 142. For example, if the capacity degradation metric 142 is relatively high (or low), the internal resistance 140 of the battery 105 may be relatively high, thereby leading to larger charge losses. The battery life estimator 154 may use the capacity degradation metric 142 to make an adjustment to its calculations so that the battery life estimate is more accurate.

The application system 150 may include an alert generator 156 configured to generate an alert based on the capacity degradation metric 142. For example, if the capacity degradation metric 142 achieves a threshold condition (e.g., exceeds or is less than a threshold level), the alert generator 156 may generate an alert regarding the battery 105. In some examples, the alert may indicate that the battery 105 has degraded to a point that it should be replaced.

The battery system 112 may include a current sensor 126 that measures the current 128, where the current 128 is the current flowing in and out of the battery 105. In the charge-mode, the current 128 may be considered a charging current. In the discharge-mode, the current 128 may be considered a discharging current. The current sensor 126 may use a sense resistor 103 to measure the current 128 (e.g., $I_{DD}$) through the battery 105. The battery system 112 includes a charge detector 115 that detects whether the battery 105 in the charge-mode or the discharge-mode based on a direction of the current 128. The battery system 112 includes a temperature monitor 120 that measures a temperature 122 associated with the battery 105. The battery system 112 includes a voltage monitor 118 that measures a cell voltage 119 of the battery 105. In some examples, the battery system 112 simultaneously monitors the current 128, the cell voltage 119, and the temperature 122.

The battery system 112 includes a state-of-charge (SoC) calculation engine 114 configured to calculate an SoC value 116. The SoC value 116 includes the level of charge of the battery 105 relative to its full capacity. A percentage of full capacity means that the battery 105 is charged to less than full capacity. The capacity of the battery 105 is the total amount of electrical charge a battery 105 is able to hold. In some examples, the SoC value 116 includes a percentage point (e.g., 0%=empty, 100%=full). The SoC calculation engine 114 may calculate the SoC value 116 based on coulomb counting such as measuring actual capacity by integrating its current 128 from completely full to completely empty (or vice-versa). However, the SoC calculation engine 114 may use other techniques to obtain the SoC value 116 such as voltage translation based on the cell voltage 119 or a combination of coulomb counting and voltage translation.

FIG. 1C illustrates a charge circuit in which the battery 105 is charged by the flow of the current 128 from the charger 104 to the battery 105. As shown in FIG. 1C, the load (e.g., the application system 150) is disconnected from the battery 105. Electrical energy is transferred from the charger 104 to the battery 105 during the charge-mode. During the charged-mode, the internal resistance 140 of the battery 105 causes a voltage difference 161 between the cell voltage 119 and the open-cell voltage 162 (e.g., OCV value) during the charge mode. For example, the voltage difference 161 may be the current 128 multiplied by the internal resistance 140. The actual voltage of the battery 105 may be the open-cell voltage 162 plus (addition to) the product of the current 128 multiplied by the internal resistance 140.

FIG. 1D illustrates a discharge circuit in which the current 128 flows from the battery 105 to the load (e.g., the application system 150). As shown in FIG. 1D, the charger 104 is disconnected from the battery 105. Electrical energy is transferred from the battery 105 to the application system 150 during the discharge-mode. The internal resistance 140 of the battery 105 causes a voltage difference 163 between the cell voltage 119 and the open-cell voltage 162 during the discharge mode. The voltage difference 163 may be the current 128 multiplied by the internal resistance 140. The actual voltage of the battery 105 may be the open-cell voltage 162 minus the product of the current 128 multiplied by the internal resistance 140.

Figure 1B:
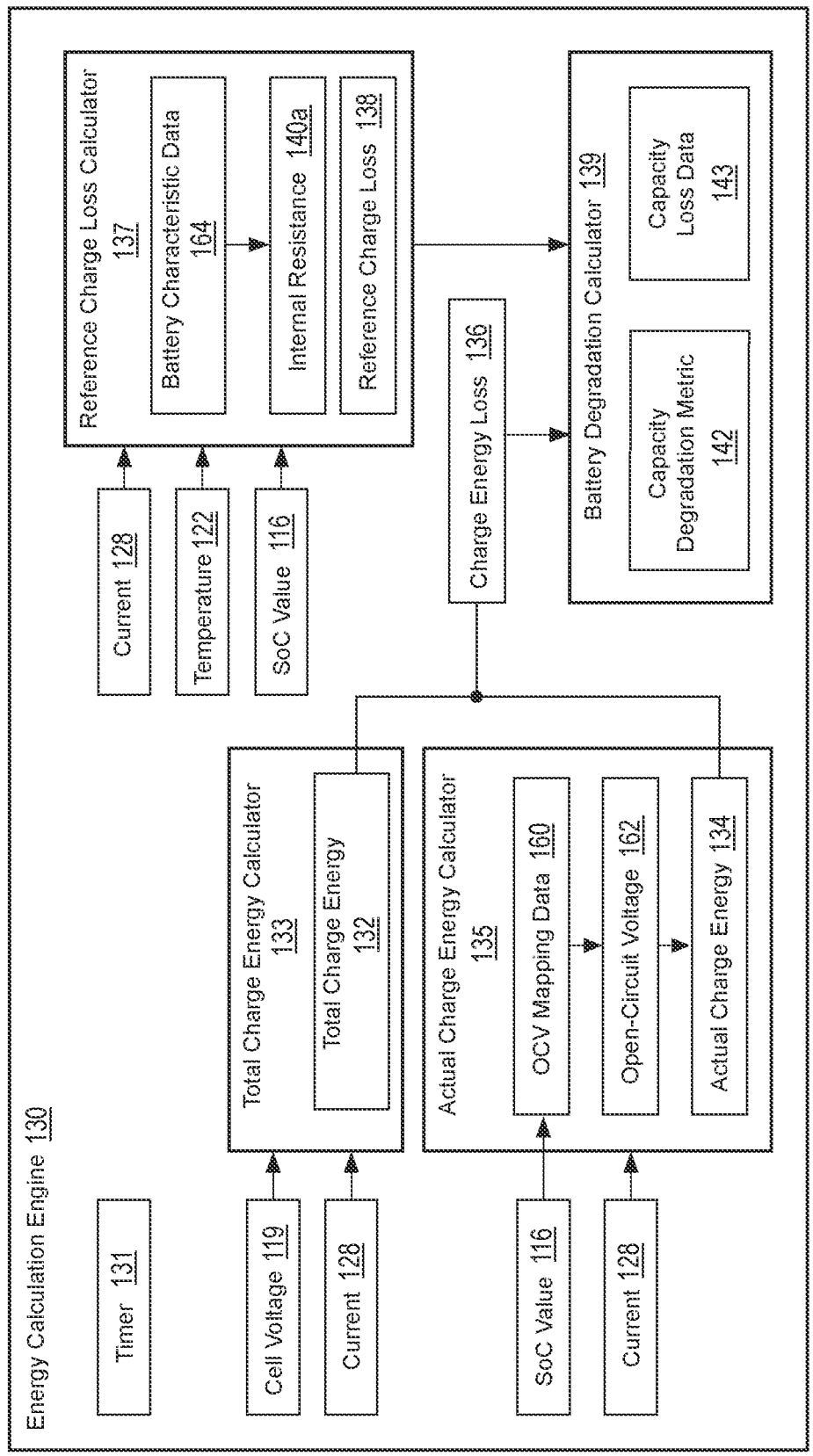
FIG. 1B illustrates an energy calculation engine of the battery system according to an aspect.
Figure 1C:
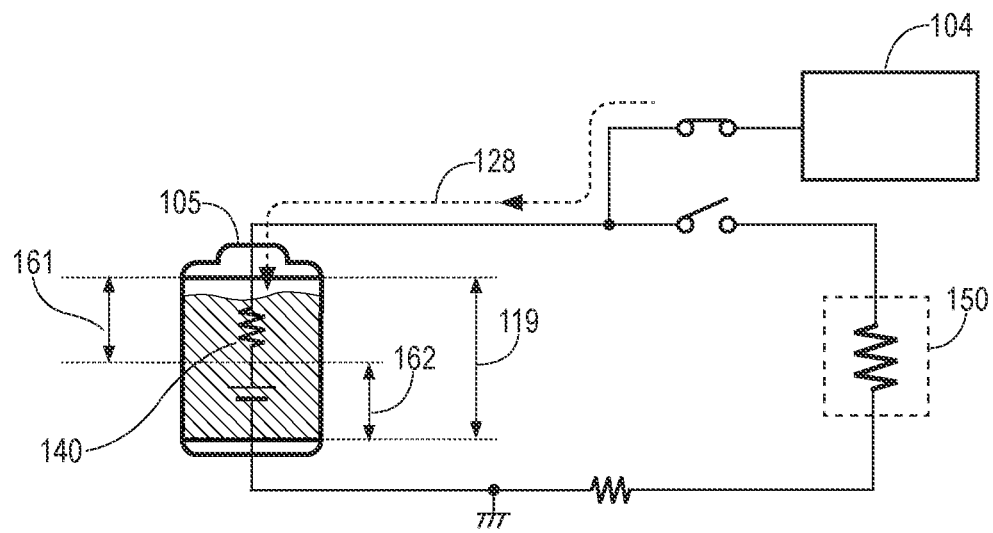
FIG. 1C illustrates a charge circuit for charging a battery of the device according to an aspect.
Figure 1D:
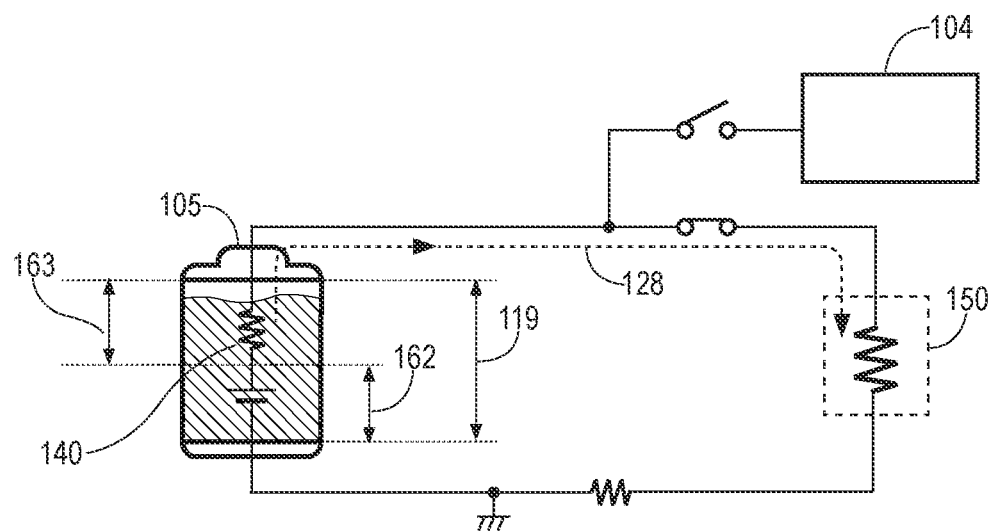
FIG. 1D illustrates a discharge circuit for discharging a battery of the device according to an aspect.
Figure 1E:
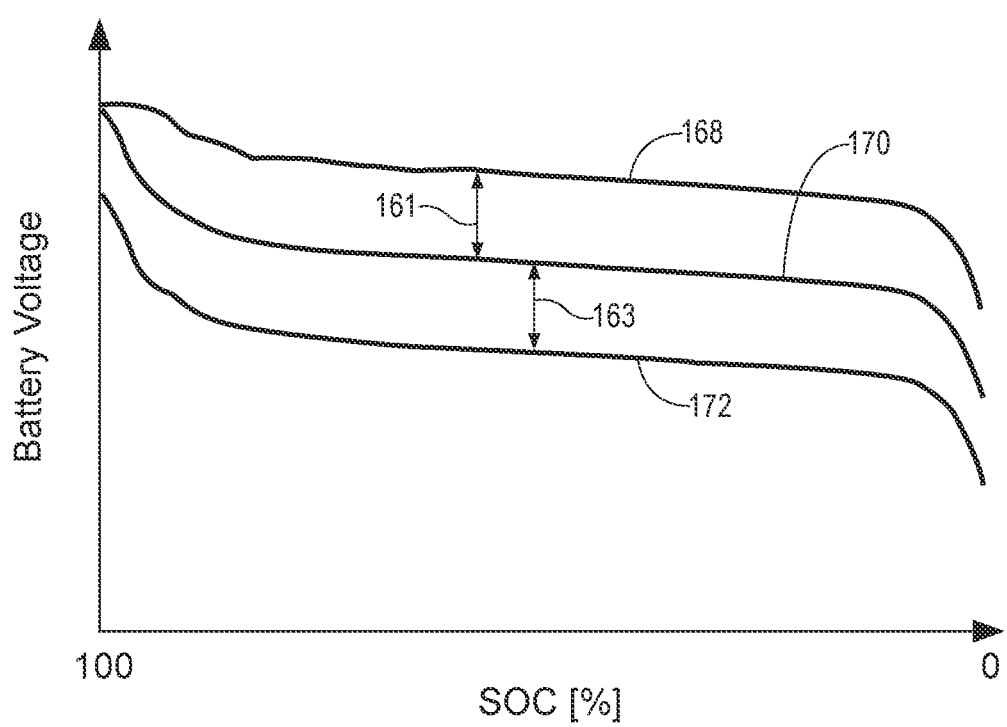
FIG. 1E illustrates a graph depicting battery voltage against state-of-charge values for a charge curve, an open-cell voltage curve, and a discharge curve according to an aspect.

FIG. 1E illustrates a graph depicting a charge curve 168, an open-cell voltage (OCV) curve 170, and a discharge curve 172, which depicts cell voltage against SoC. For example, the charge curve 168 depicts the cell voltage against decreasing values of SoC during the charge-mode. The discharge curve 172 depicts the cell voltage against decreasing values of SoC during the discharge mode. The OCV curve 170 provides the open-cell voltage. The difference between the charge curve 168 and the OCV curve 170 depicts the voltage difference 161 caused by the internal resistance 140 during the charged mode. The difference between the discharge curve 172 and the OCV curve 170 depicts the voltage difference 163 caused by the internal resistance 140 during the discharge mode.

Referring back to FIG. 1A, the battery system 112 may include an energy calculation engine 130 configured to compute a capacity degradation metric 142 based on the SoC value 116, the cell voltage 119, the temperature 122, and the current 128. The energy calculation engine 130 includes a processor 111 (e.g., a microcontroller), where the processor 111 is configured to execute instructions, which may be stored in a non-transitory computer-readable medium 113 to perform various actions, such as those described in this disclosure. The non-transitory computer-readable medium 113 may be any type of non-transitory storage medium that is used to store information used by the energy calculation engine 130 and instructions for execution by the energy calculation engine 130.

The energy calculation engine 130 computes a total charge energy 132 of the battery 105 and an actual charge energy 134 of the battery 105. In some examples, the energy calculation engine 130 computes a charge energy loss 136 based on a difference of the total charge energy 132 and the actual charge energy 134. In some examples, the energy calculation engine 130 computes a reference charge loss 138 for a reference battery (e.g., a new battery). In some examples, the energy calculation engine 130 computes the capacity degradation metric 142 based on the charge energy loss 136 and the reference charge loss 138. In some examples, the energy calculation engine 130 compares the charge energy loss 136 and the reference charge loss 138 to extract the internal resistance 140 of the battery 105, and the internal resistance 140 is used to calculate the capacity degradation metric 142.

Referring to FIG. 1B, the energy calculation engine 130 may include a total charge energy calculator 133 configured to compute the total charge energy 132 for a sampling time indicated by a timer 131. For example, the total charge energy calculator 133 may receive the cell voltage 119 and the current 128 and compute the total charge energy 132 based on the cell voltage 119, the current 128, and the sampling time indicated by the timer 131 (e.g., total charge energy=$(V_{cell\_voltage} * I_{DD})*$Time).

The energy calculation engine 130 may include an actual charge energy calculator 135 configured to compute the actual charge energy 134 for the sampling period indicated by the timer 131. For example, the actual charge energy calculator 135 may receive the SoC value 116 and the current 128 and compute the actual charge energy 134 based on the SoC value 116 and the current 128. The actual charge energy calculator 135 includes OCV mapping data 160. The OCV mapping data 160 may include table data that provides OCV values for various SoC values. The actual charge energy calculator 135 may obtain the appropriate value for the open-cell voltage 162 based on the SoC value 116 using the OCV mapping data 160. For example, the OCV mapping data 160 may define a first OCV value for a given first SoC value, a second OCV value for a given second SoC value, and a third OCV value for a given SoC value, and so forth. If the SoC value 116 is the second SoC value, the actual charge energy calculator 135 may obtain the second OCV value for the open-cell voltage 162. In some examples, the OCV mapping data 160 is included in the SoC calculation engine 114, and the energy calculation engine 130 receives the open-cell voltage 162 from the SoC calculation engine 114. The open-cell voltage 162 is used to calculate the actual charge energy 134. For example, the actual charge energy calculator 135 may compute the actual charge energy 134 based on the open-cell voltage 162, the current, and the sampling time indicated by the timer 131 (e.g., actual charge energy=$(V_{OCV}*I_{DD})*$Time).

Figure 1F:
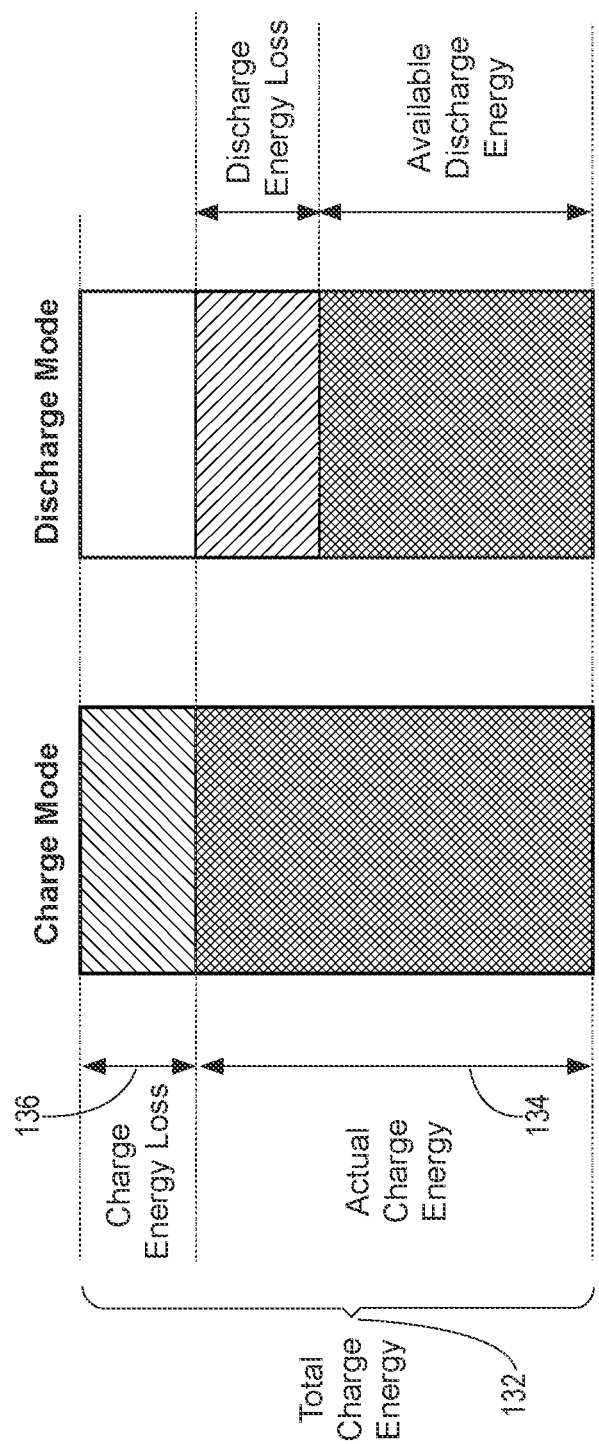
FIG. 1F illustrates charge energy loss during a charge mode and a discharge mode according to an aspect.

The energy calculation engine 130 may compute the charge energy loss 136 based on the total charge energy 132 and the actual charge energy 134. In some examples, in the discharge-mode, the charge energy loss 136 may be referred to as discharge energy loss. For example, the energy calculation engine 130 computes the charge energy loss 136 based on a difference between the total charge energy 132 and the actual charge energy 134. As shown in FIG. 1F, with respect to the charge-mode, the total charge energy 132 is the sum of the actual charge energy 134 and the charge energy loss 136. In the discharge mode, the actual charge energy 134 is the sum of the available discharge energy and the discharge energy loss.

In some examples, the energy calculation engine 130 is configured to compute the charge energy loss 136 (or the discharge energy loss if in the discharge-mode) caused by the internal resistance 140 of the battery 105 based on a voltage difference $(\Delta V) \times I_{DD} \times$ time, where $\Delta V$ is the difference between open-cell voltage 162 and the cell voltage 119, the current ($I_{DD}$) is the current 128 measured by the current sensor 126, and the time is the sampling period. If the charge mode is detected by the charge detector 115, $\Delta V$ (e.g., the voltage difference 161) is the cell voltage 119 minus the open-cell voltage 162. If the discharge-mode is detected by the charge detector 115, $\Delta V$ (e.g., the voltage difference 163) is the open-cell voltage 162 minus the cell voltage 119. In some examples, $\Delta V$ (e.g., the voltage difference 161 or the voltage difference 163) is also equal to the internal resistance 140 (aged R(in)) multiplied by the current 128 ($I_{DD}$), where the charge energy loss 136 is equal to aged R(in)$\times I_{DD} \times I_{DD} \times$time.

The energy calculation engine 130 includes a reference charge loss calculator 137 configured to compute a reference charge loss 138. For example, the reference charge loss calculator 137 includes battery characteristic data 164 that provides values for an internal resistance 140a of a reference battery (e.g., a new battery) as a function of temperature and SoC values. The reference charge loss calculator 137 may receive the temperature 122 and/or the SoC value 116 and select an internal resistance 140a from the battery characteristic data 164 using the temperature and/or the SoC value 116 as input(s) to the battery characteristic data 164. The internal resistance 140a may represent the internal resistance of a reference (new) battery. In some examples, the internal resistance 140a of the reference battery may be referred to as new R(in). The energy calculation engine 130 may compute the reference charge loss 138 based on the current 128, the internal resistance 140a, and the sampling time indicated by the timer 131 (e.g., new $R_{(in)}*I_{DD}*I_{DD}*$Time).

In some examples, the battery characteristic data 164 may identify values of the internal resistance 140a for the reference battery as a function of temperature and/or SoC. For example, the internal resistance may change based on the temperature and/or SoC. For relatively low temperatures, the internal resistance may be higher. Also, in some examples, the internal resistance may have different values depending on the SoC level. In some examples, the battery characteristic data 164 includes a look-up table that provides the reference battery's internal resistance for different values of temperature and/or SoC.

Figure 1G:
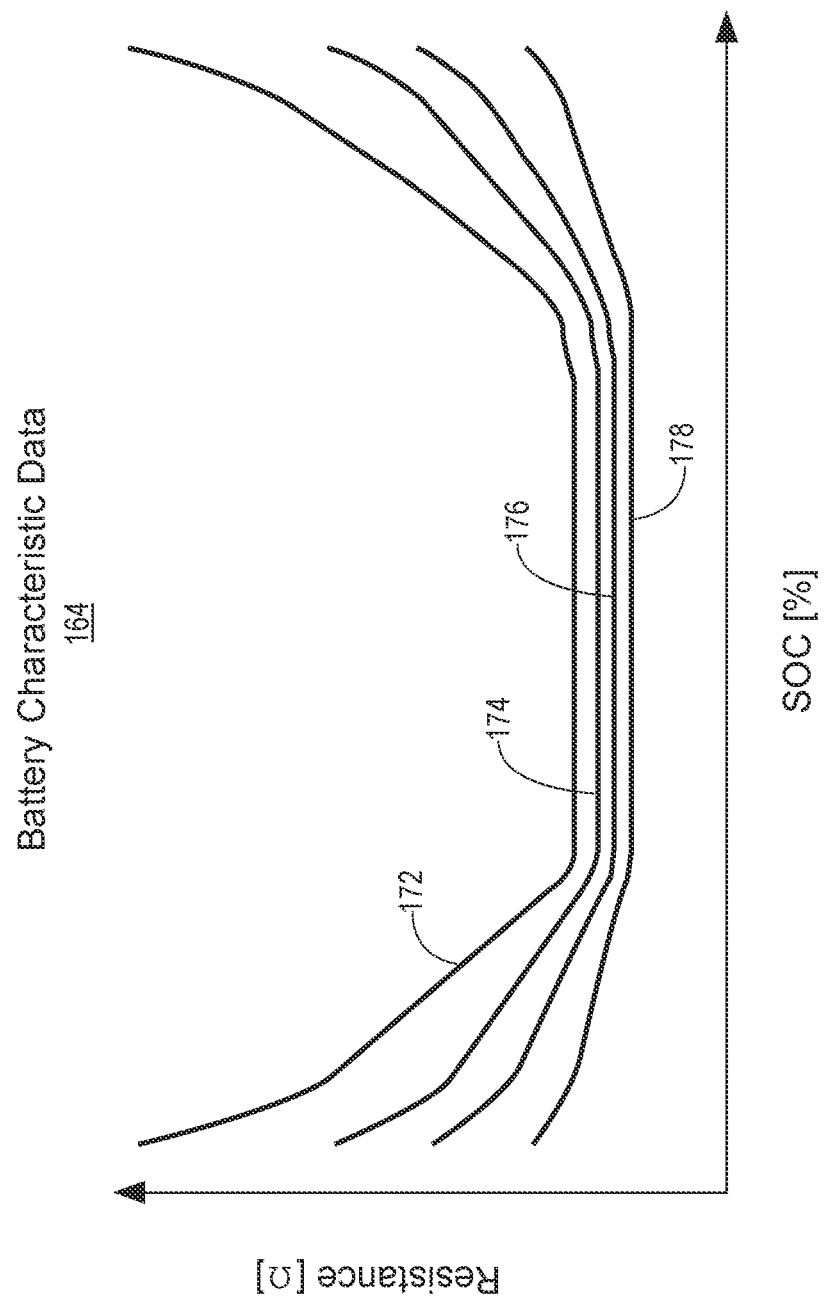
FIG. 1G illustrates an example of battery characteristic data for computing reference charge loss according to an aspect.

As shown in FIG. 1G, the battery characteristic data 164 may include various values for the internal resistance 140a as a function of temperature and/or SoC. For example, FIG. 1G illustrates a graphical view of an internal resistance curve 171 corresponding to a first temperature, an internal resistance curve 173 corresponding to a second temperature, an internal resistance curve 175 corresponding to a third temperature, and an internal resistance curve 177 corresponding to a fourth temperature. However, the battery characteristic data 164 may provide internal resistances 140a for a range of temperatures. If the measured temperature 122 is the second temperature, the reference charge loss calculator 137 may derive the value for the internal resistance 140a from the internal resistance curve 173 using the calculated SoC value 116.

The energy calculation engine 130 includes a battery degradation calculator 139 that computes the capacity degradation metric 142 based on the reference charge loss 138 and the charge energy loss 136. For example, the battery degradation calculator 139 may compute a ratio of the reference charge loss 138 and the charge energy loss 136.

The battery degradation calculator 139 may compare the reference charge loss 138 with the charge energy loss 136 to compute the capacity degradation metric 139. In some examples, the battery degradation calculator 139 computes a ratio of the reference charge loss 138 with the charge energy loss 136 to derive the capacity degradation metric 142. In some examples, the ratio (charge energy loss/reference charge loss) is equal to the ratio (aged R(in)/new R(in)), and the battery degradation calculator 139 may extract the battery's internal resistance 140 (e.g., aged R(in)) using the charge energy loss 136, the reference charge loss 138, and the new R(in) (internal resistance 140a) based on the equation [(charge energy loss/reference charge loss)= (aged (Rin)/(new R(in)]. In here, with this calculation, the amount of energy loss includes accumulation of internal resistance in the sampling range of a certain SoC, so the resulting ratio of [(charge energy loss/reference charge loss)=(aged (Rin)/(new R(in)] may become accurate by data averaging on the process of sampling. In some examples, the battery degradation calculator 139 may compute the capacity degradation metric 142 based on the battery's internal resistance 140 (aged R(in)) and the reference battery's internal resistance 140a (new R(in)) (e.g., SoH is new R(in)/aged R(in)×100). In some examples, the battery degradation calculator 139 includes capacity loss data 143 that provides capacity loss values for different values of internal resistance 140. In some examples, the battery degradation calculator 139 may compute the capacity degradation metric 142 based on the capacity loss value obtained from the capacity loss data 143 using the battery's internal resistance 140 (aged R(in)).

Figure 2:
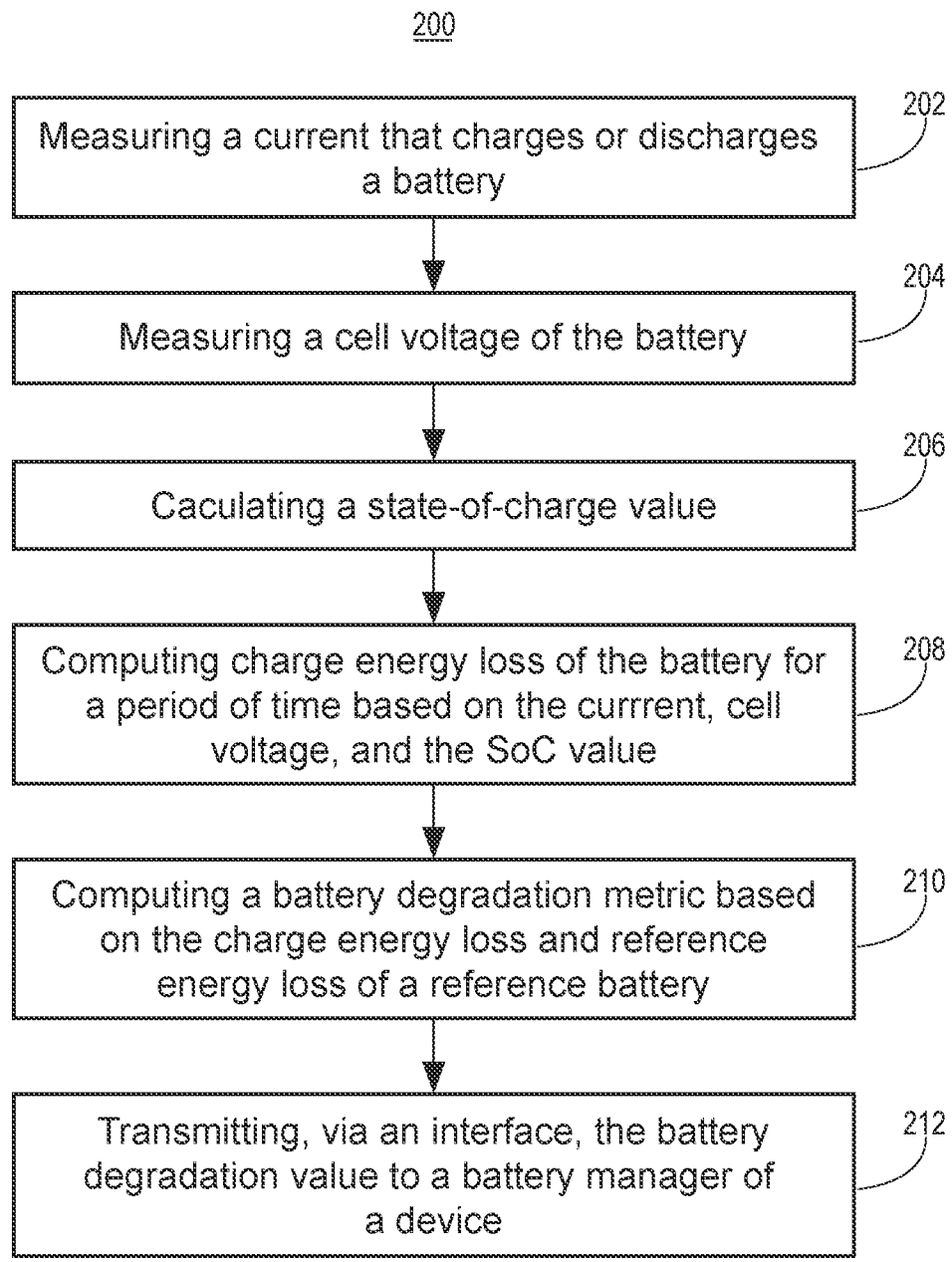
FIG. 2 illustrates a flowchart depicting example operations of a battery system for calculating a capacity degradation metric according to an aspect.

FIG. 2 depicts a flowchart 200 depicting example operations of a battery system for computing a capacity degradation metric. The flowchart 200 is explained with reference to the battery system 112 of FIGS. 1A through 1G. Although the flowchart 200 of FIG. 2 illustrates operations in sequential order, it will be appreciated that this is merely an example, and that additional or alternative operations may be included. Further, operations of FIG. 2 and related operations may be executed in a different order than that shown, or in a parallel or overlapping fashion.

Operation 202 includes measuring a current 128 that charges or discharges a battery 105. Operation 204 includes measuring a cell voltage 119 of the battery 105. Operation 206 includes calculating an SoC value 116. Operation 208 includes computing charge energy loss 136 of the battery 105 during a sampling period based on the current 128, the cell voltage 119, and the SoC value 116. Operation 210 includes computing a capacity degradation metric 142 based on the charge energy loss 136 and reference charge loss 138 of a reference battery. Operation 212 includes transmitting, via an interface 148, the capacity degradation metric 142 to a battery manager 152 of a device 100.

Figure 3:
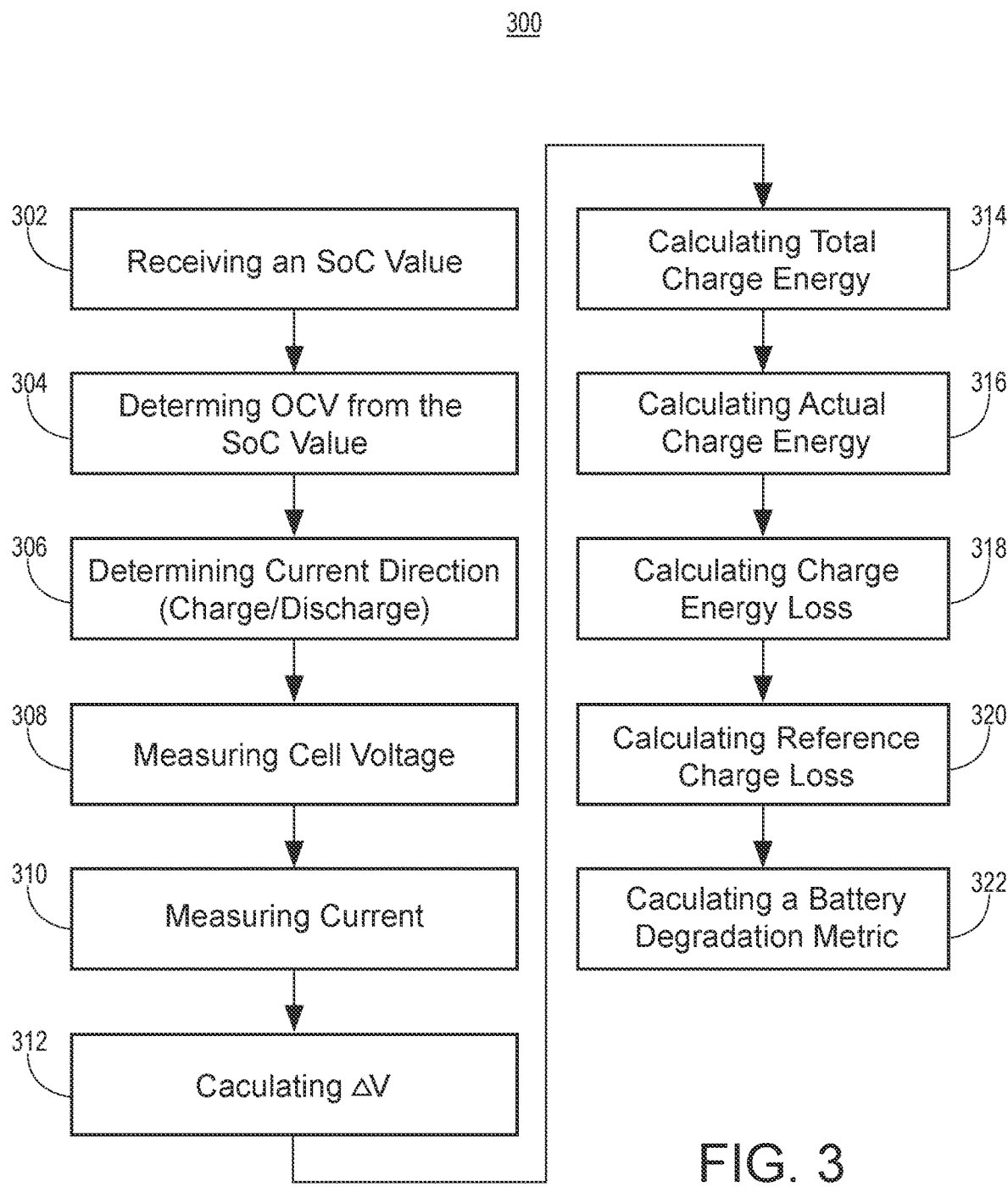
FIG. 3 illustrates a flowchart depicting example operations of a battery system for calculating a capacity degradation metric according to another aspect.

FIG. 3 depicts a flowchart 300 depicting example operations of a battery system for computing a capacity degradation metric. The flowchart 300 is explained with reference to the battery system 112 of FIGS. 1A through 1G. Although the flowchart 300 of FIG. 3 illustrates operations in sequential order, it will be appreciated that this is merely an example, and that additional or alternative operations may be included. Further, operations of FIG. 3 and related operations may be executed in a different order than that shown, or in a parallel or overlapping fashion.

Operation 302 includes receiving (e.g., obtaining) an SoC value 116. Operation 304 includes determining (e.g., obtaining) open-cell voltage 162 from the SoC value 116. Operation 306 includes determining current direction (e.g., charge-mode or discharge mode). Operation 308 includes measuring cell voltage 119. Operation 310 includes measuring current 128. Operation 312 includes calculating $\Delta V$ (e.g., voltage difference 161 or voltage difference 163). Operation 314 includes calculating total charge energy 132. Operation 316 includes calculating actual charge energy 134. Operation 318 includes calculating charge energy loss 136. Operation 320 includes calculating reference charge loss 138. Operation 322 includes calculating a battery degradation value 142.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A battery system comprising:
   a current sensor configured to measure a current that charges or discharges a battery;
   a voltage monitor configured to measure a cell voltage of the battery;
   a state-of-charge (SoC) calculation engine configured to calculate an SoC value; and
   an energy calculation engine configured to:
     compute charge energy loss of the battery for a sampling period based on the current, cell voltage, and the SoC value; and
     compute a capacity degradation metric based on the charge energy loss and reference charge loss of a reference battery,
   the energy calculation engine configured to transmit, via an interface, the capacity degradation metric to a battery manager of a device.

2. The battery system of claim 1, wherein the energy calculation engine is configured to:
   derive an open-cell voltage from the SoC value;
   compute the charge energy loss based on the current and a difference between the cell voltage and the open-cell voltage.

3. The battery system of claim 1, wherein the energy calculation engine is configured to:
   derive an open-cell voltage from the SoC value;
   compute actual charge energy of the battery based on the open-cell voltage and the current;
   compute total charge energy of the battery based on the cell voltage and the current; and
   compute the charge energy loss based on the actual charge energy and the total charge energy.

4. The battery system of claim 1, wherein the energy calculation engine is configured to:
   determine an internal resistance of the reference battery from battery characteristic data using at least one of temperature or the SoC value;
   compute the reference charge loss of the reference battery based on the internal resistance of the reference battery and the current.

5. The battery system of claim 1, wherein the energy calculation engine is configured to compute the capacity degradation metric based on a ratio of the reference charge loss and the charge energy loss.

6. The battery system of claim 1, further comprising:
a charge detector configured to determine whether the battery is in a charge mode or a discharge mode.

7. The battery system of claim 6, wherein the energy calculation engine is configured to be activated during the charge mode to compute the capacity degradation metric.

8. The battery system of claim 6, wherein the energy calculation engine is configured to be activated during the discharge mode to compute the capacity degradation metric.

9. A device comprising:
a battery;
a current sensor configured to measure a current that charges or discharges the battery;
a voltage monitor configured to measure a cell voltage of the battery;
a state-of-charge (SoC) calculation engine configured to obtain SoC value; and
an energy calculation engine configured to:
compute charge energy loss of the battery for a sampling period based on the current, the cell voltage, and the SoC value; and
compute a capacity degradation metric based on the charge energy loss and reference charge loss of a reference battery; and
a battery manager configured to receive, via an interface, the capacity degradation metric from the energy calculation engine.

10. The device of claim 9, wherein the energy calculation engine is configured to:
derive an open-cell voltage from the SoC value; and
compute the charge energy loss based on the current and a difference between the cell voltage and the open-cell voltage.

11. The device of claim 9, wherein the energy calculation engine is configured to:
derive an open-cell voltage from the SoC value;
compute actual charge energy of the battery based on the open-cell voltage and the current;
compute total charge energy of the battery based on the cell voltage and the current; and
compute the charge energy loss based on the actual charge energy and the total charge energy.

12. The device of claim 9, wherein the energy calculation engine is configured to:
determine an internal resistance of the reference battery from battery characteristic data using at least one of temperature or the SoC value; and
compute the reference charge loss of the reference battery based on the internal resistance of the reference battery and the current.

13. The device of claim 9, wherein the capacity degradation metric includes a state of health metric.

14. The device of claim 9, further comprising:
a charge detector configured to determine whether the battery is in a charge mode or a discharge mode,
wherein the energy calculation engine is configured to be activated during the charge mode to compute the capacity degradation metric, or
wherein the energy calculation engine is configured to be activated during the discharge mode to compute the capacity degradation metric.

15. The device of claim 9, wherein the battery manager includes a battery life estimator configured to adjust a battery life estimate based on the capacity degradation metric.

16. The device of claim 9, wherein the battery manager includes an alert generator configured to generate an alert in response to the capacity degradation metric achieving a threshold level.

17. A method comprising:
measuring a current that charges or discharges a battery;
measuring a cell voltage of the battery;
calculating a state-of-charge (SoC) value;
computing charge energy loss of the battery for a sampling period based on the current, the cell voltage, and the SoC value;
computing a capacity degradation metric based on the charge energy loss and reference charge loss of a reference battery; and
transmitting, via an interface, the capacity degradation metric to a battery manager of a device.

18. The method of claim 17, wherein the computing the charge energy loss energy includes:
deriving an open-cell voltage from the SoC value; and
computing the charge energy loss based on the current and a difference between the cell voltage and the open-cell voltage.

19. The method of claim 17, wherein the computing the charge energy loss energy includes:
deriving an open-cell voltage from the SoC value;
computing actual charge energy of the battery based on the open-cell voltage and the current;
computing total charge energy of the battery based on the cell voltage and the current; and
computing the charge energy loss based on the actual charge energy and the total charge energy.

20. The method of claim 17, further comprising:
determining an internal resistance of the reference battery from battery characteristic data using at least one of temperature or the SoC value;
computing the reference charge loss of the reference battery based on the internal resistance of the reference battery and the current; and
computing the capacity degradation metric based on a ratio of the reference charge loss and the charge energy loss.

* * * * *